United States Patent [19]
AuYeung et al.

[11] Patent Number: 5,404,367
[45] Date of Patent: Apr. 4, 1995

[54] SCANNER DROOP AND CROSS TALK CORRECTION

[75] Inventors: Vincent W. AuYeung, Temple City; Larry Yuzuki, Los Angeles, both of Calif.

[73] Assignee: Xerox Corporation, Stamford, Conn.

[21] Appl. No.: 270,352

[22] Filed: Jul. 5, 1994

[51] Int. Cl.⁶ ................................................ H01S 3/00
[52] U.S. Cl. .......................................... 372/33; 372/38
[58] Field of Search ............................... 372/33, 38, 29

[56] References Cited

U.S. PATENT DOCUMENTS 5,309,269  5/1994  Shibao .................................... 372/38
5,335,239  8/1994  Herczeg et al. ........................ 372/38

Primary Examiner—Rodney B. Bovernick
Assistant Examiner—Robert E. Wise
Attorney, Agent, or Firm—Fariba Rad

[57] ABSTRACT

A laser diode assembly is disclosed which utilizes a feedback system which substantially reduces the dependency of the optical output power of the laser diode on laser junction temperature which is dependent on the pixel pattern. The feedback system of this invention utilizes a low pass filter to detect the low frequencies of the train of pixel information which cause a certain droop. The low pass filter generates a signal based on the detected frequencies which after being scaled will be used as a feedback signal. The feedback signal will be applied to the driver of the laser diode to adjust the driving current of the laser diode for the detected patterns to substantially reduce the droop and the cross talk.

1 Claim, 3 Drawing Sheets

FIG. 1
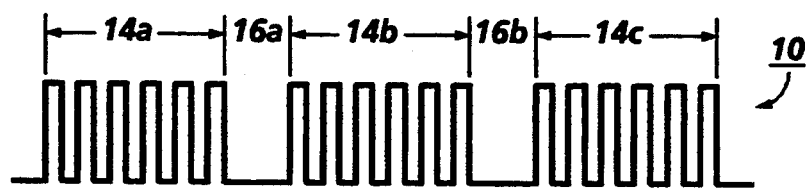
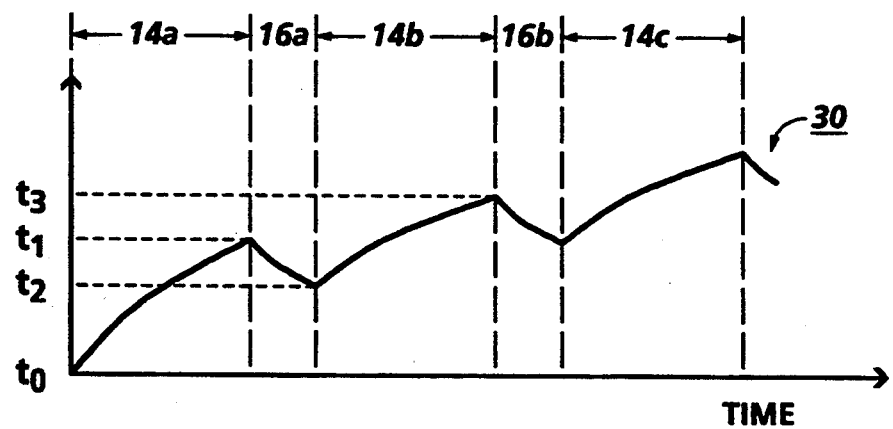
FIG. 2

FIG. 3
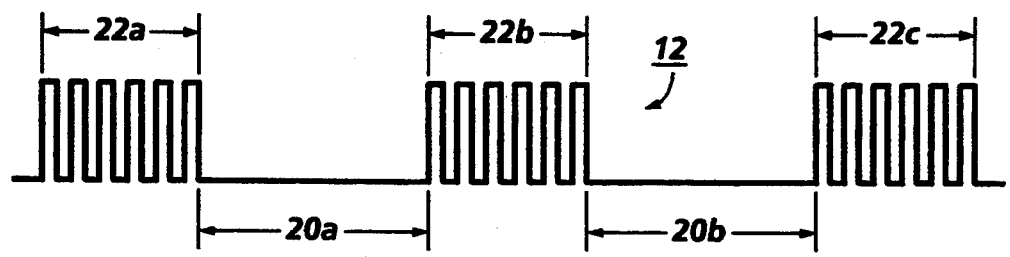
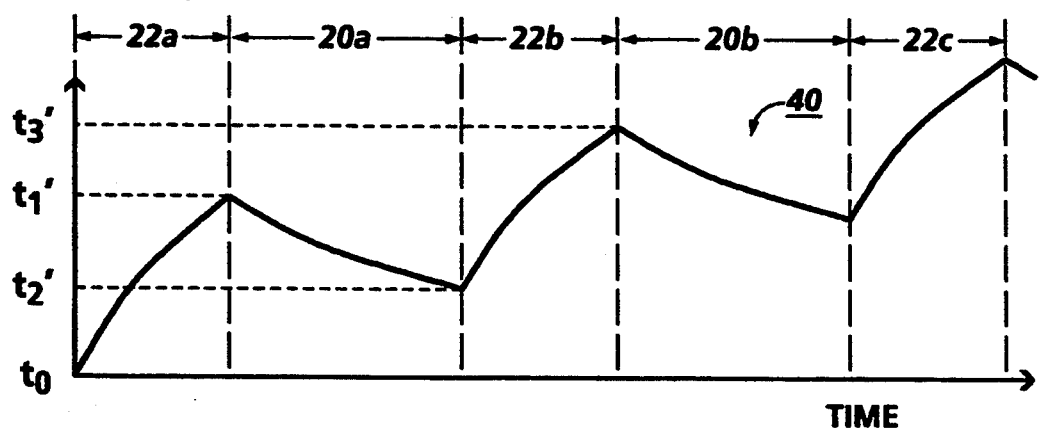
FIG. 4

SCANNER DROOP AND CROSS TALK CORRECTION

BACKGROUND OF THE INVENTION

This invention relates generally to laser diodes and more particularly concerns a feedback system which utilizes a low pass filter to generate a feedback signal for adjusting the current of the laser diode to substantially correct the dependence of optical output power on laser junction temperature which is dependent on the pixel pattern.

Usually, in a scanning system, the light beam from the laser diode is modulated by a train of image pixel information. The pixel information is used to drive the diode and therefore stimulate laser emission where there is an on pixel. Since the emission of the light beam follows the pattern of the train of pixel information, this is called "modulation of the light beam by the train of pixel information".

Due to the structure of the laser diode assembly, as the pixels change, the temperature of the diode fluctuates which in turn causes the optical output power of the diode (intensity of the light beam) and the wave length of the light beam, generated by the diode, to fluctuate. In a printing system, fluctuations of the optical output power cause fluctuations in the size of printed pixels which is not desirable.

The optical output power of a laser diode is highly sensitive to the temperature of the junction. When the laser diode is turned on, it heats itself up and typically within fifty to a few hundreds of microseconds causes its optical output power to settle down to a decreased output by several percents, a phenomenon called "droop". In multiple channel laser diodes, the droop and pixel information leakage of one channel can affect the adjacent channels causing variation on the output power of the adjacent channels which is known as cross talk.

In addition, droop is dependent on the pattern and the duty cycle of the pixels of the of the train of pixel information which is applied to the laser diode. Every time there is an On pixel, since the diode starts emitting light, the junction of the diode heats up. Due to this generated heat, the temperature of the diode increases. However, where there is an Off pixel, the diode does not generate any heat and it cools down.

Therefore, the temperature of the diode depends on the pattern of the train of pixel information. As a result, the intensity of the light beam and therefore the size of the printed pixels depend on the pattern of the train of pixel information.

Minimizing the fluctuations of the optical output power would result in more accurate printed pages with improved image quality. Ideally, in order to keep the optical output power of the diode (intensity of the light beam) and the wavelength of the light beam generated by the diode constant, the temperature of the diode should be kept at a constant level. However, this requires the use of thermoelectric cooler which is expensive and can not respond fast enough to fluctuations of the modulation duty cycle.

Typically, to reduce the fluctuations of the optical output power, a feedback system should be connected to the laser diode to generate a feedback signal in accordance with the fluctuations of the heat. The feedback signal will adjust the current of the laser diode to change the optical output power as needed. Ideally, the feedback signal should be generated while the train of pixel information is being applied to the laser diode (real time).

However, real time feedback systems have the disadvantages of being very expensive to construct, requiring extremely fast components to effectively measure and provide a real time response to the real time fluctuations of the heat. Therefore, some other methods must be found.

SUMMARY OF THE INVENTION

The present invention is directed to a feedback system in a raster output scanner which substantially reduces the droop of a single channel laser diode and the droop and the cross talk of multiple channel laser diodes caused by the variation of the pixel pattern being printed. The feedback system of this invention utilizes a low pass filter to sample the pixel pattern in real time and pass the low frequencies contained in the train of pixel information which cause the droop and the cross talk. The output of the low pass filter will be scaled to represent a certain percentage of the exposure level. The scaled output will be used as a feedback signal to be added to the diode driving current in real time to raise the optical output power of the laser diode accordingly. The feedback signal of this invention adjusts the output current of the laser diode driver which reduces the droop and cross talk problems.

BRIEF DESCRIPTION OF THE DRAWINGS

FIG. 1 shows a train of high frequency pixel information;

FIG. 2 shows the fluctuations of the junction temperature of a laser diode as a function of the pixel information of FIG. 1;

FIG. 3 shows a train of low frequency pixel information;

FIG. 4 shows the fluctuations of the junction temperature of a laser diode as a function of the pixel information of FIG. 3.

DESCRIPTION OF THE PREFERRED EMBODIMENT

Figure 5:
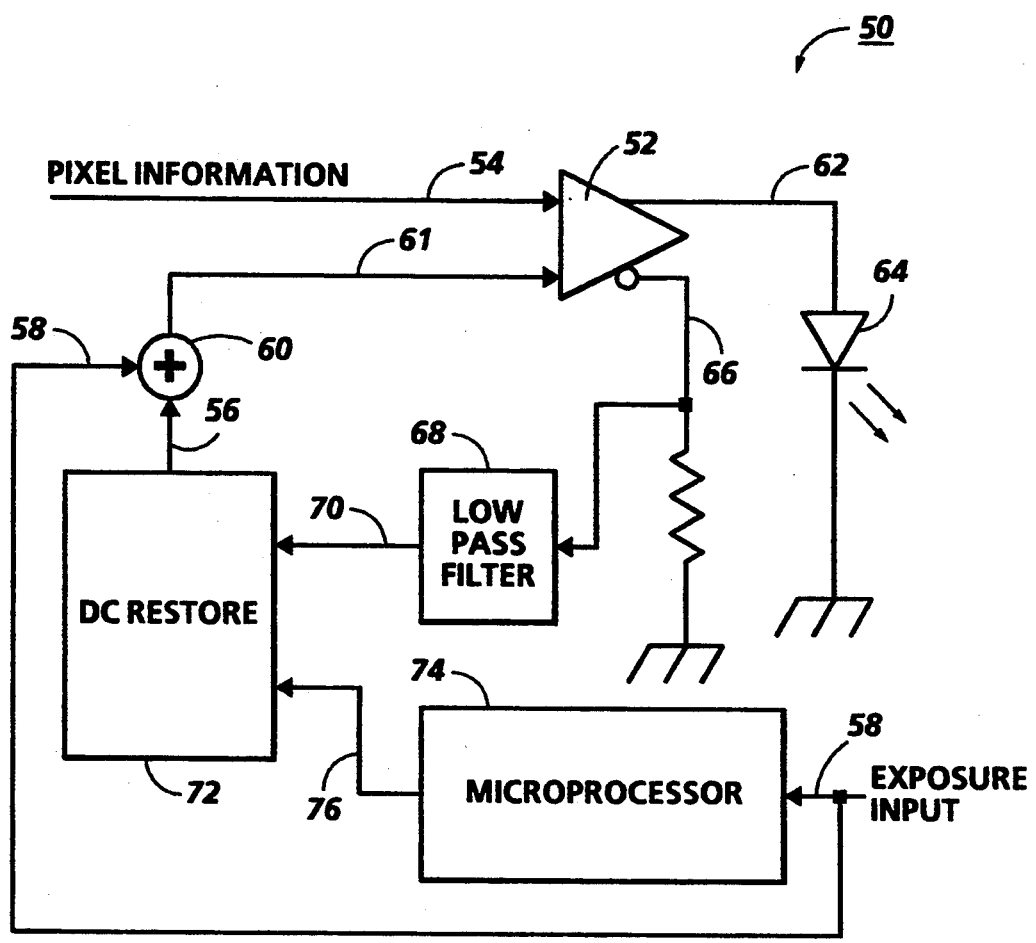
FIG. 5 shows a block diagram of this invention.

In this invention it is suggested that the droop of the output power of a laser diode is caused by the low frequencies contained in the train of pixel information applied to the laser diode. In a train of pixel information, the time allocated to each pixel is a fixed time. However, the pattern between the On pixels and Off pixels can contain a high frequency or low frequency.

For example, referring to FIG. 1 there is shown a train of high frequency pixel information 10 and referring to FIG. 3, there is shown a train of low frequency pixel information 12. In FIG. 1, there are pockets of active pixels 14a–14c (groups of On and Off pixels close to each other) and then there are dead times 16a and 16b (Off pixel) in between the pockets of active pixels 14a–14c. The pattern shown in FIG. 1 is called high frequency since the dead times 16a and 16b between the pockets of active pixels 14a–14c are short which make the occurrence of pockets of the active pixels close to each other.

However, referring to FIG. 3, since the dead times 20a and 20b between the pockets of active pixels 22a–22c are long, the occurrence of pockets of the active pixels 22a-22c are far apart. Therefore this pattern is called low frequency.

Hereinafter, the low frequency pixel information shall mean a train of pixel information in which the occurrence of pockets of the active pixels are far apart. The ranges of low frequencies and high frequencies will be defined further in the specification.

It should be noted that in FIGS. 1 and 3 although the number of the On and Off pixels in each pocket of active pixels is shown as equal, they do not have to be equal.

As it was described previously, droop is dependent on the junction temperature of the laser diode and the junction temperature is dependent on the pattern and the duty cycle of the pixels of the train of pixel information which is applied to the laser diode.

It should be noted that since during the pockets of active pixels, the diode is turning On and Off at very high rate, the pockets of active pixels will have the effect of a group of On pixels. Therefore every time there is a pocket of active pixels, the diode starts emitting light and the junction of the diode heats up and where there is a dead time, the diode does not generate any heat and it cools down.

Referring to FIG. 2, there is shown the fluctuations of the junction temperature 30 of a laser diode as a function of the pixel information 10 of FIG. 1. In FIG. 2, the horizontal axis represents the time and the vertical axis represents the temperature.

During a high frequency pixel information, since the dead times between the occurrence of pockets are short, when there is a dead time, the diode does not have enough time to cool down. As soon as the temperature starts to drop the next pocket of active pixels arrives which causes the temperature to start increasing.

For example, referring to both FIGS. 1 and 2, when there is a pocket of active pixels 14a, the temperature of the diode, which is at $t_0$, starts to increase to $t_1$. When there is a dead time 16a, the diode does not have enough time to cool down substantially. Therefore, the temperature cools down to $t_2$ which is close to $t_1$. On the arrival of the next pocket of active pixels 14b, the laser diode already has a high temperature $t_2$. Due to the high temperature of the laser diode, the following pocket of active pixels 14b does not increase the temperature of the diode by far. As a result, the temperature of the laser diode increases to $t_3$ which is not much higher than $t_1$.

In contrast, referring to FIG. 4, there is shown the fluctuations of the junction temperature 40 of the laser diode as a function of the pixel information 12 of FIG. 3. In FIG. 4, the horizontal axis represents the time and the vertical axis represents the temperature.

Referring to both FIGS. 3 and 4, since the frequency of the pixel information is low, the dead times 20a and 20b between the pockets of active pixels 22a-22c is long. Therefore, when there is a pocket of active pixels 22a, the temperature of the diode, which is at $t_0$, starts to increase to $t_1'$. When there is a dead time 20a, the diode has enough time to cool down to $t_2'$ and when the next pocket of active pixels 22b arrives, the diode has to heat up from a cooler temperature $t_2'$ compared to the temperature $t_2$ (FIG. 2) of the high frequency. This causes a higher temperature increase for the following pocket of active pixels. Therefore, at the pocket of active pixels 22b, the absolute value of the temperature increase ($t_3'-t_2'$) is higher than the absolute value of the temperature increase ($t_3-t_2$) of FIG. 2 for the high frequency pixel information.

Referring to FIGS. 2 and 4, in comparison, the fluctuations of the junction temperature 40 as a function of low frequency pixel information (FIG. 4) have a greater magnitude than the fluctuations of the junction temperature 30 as a function of high frequency pixel information (FIG. 2). It should be noted that the higher the magnitude of the fluctuations of the junction temperature, the higher the amount of the droop of the optical output power. Therefore, the low frequencies which cause higher temperature fluctuations also cause a higher optical output power droop.

Typically, droop of a laser diode, the difference between the maximum optical output power and the minimum optical output power, should not exceed a certain percentage of the maximum optical output power. The percentage of the of the maximum optical output power which defines the droop depends on the sensitivity of a given raster scanning system.

The approach of this invention to correct the droop problem is to concentrate on the low frequencies contained in the train of pixel information which cause major fluctuations in the junction temperature. The range of the low frequencies varies for different scanning systems. In the preferred embodiment of this invention, the range of low frequencies is defined by frequencies which cause cross talk or a droop of 4% or more within 600 psec.

Referring to FIG. 5, there is shown a block diagram 50 of this invention. Laser diode driver 52 receives a train of pixel information 54 and in the absence of a feedback signal 56, receives an exposure level 58 from adder 60 through current 61 to generate a proper driving current 62 for laser diode 64. The laser diode driver 52 also provides the current 66, which is the complement of the driving current 62, to a low pass filter 68. In the preferred embodiment of this invention, the low pass filter 68 is selected to pass only the frequencies which cause the 4% droop within 600 psec.

It should be noted that connecting the current 66 to the low pass filter 68 is a matter of choice and one can design a circuit in which the driving current 62 is connected to the low pass filter.

It should also be noted that the reason for connecting the signal 66 from the laser diode driver 52 to the low pass filter 68 instead of the train of pixel information 54 is that current 62 is the driving current which drives the laser diode and causes the fluctuations of the junction temperature. Therefore, in order to select the frequencies which cause the droop, the currents 62 or 66 from the laser diode driver 52 are more appropriate as opposed to the pixel information 54.

The low pass filter 68 receives the signal 66 and passes only the low frequencies which cause the droop or the cross talk. The low pass filter 68 generates a signal 70 which its amplitude varies according to different frequencies of the train of pixel information contained in current 66 regardless of the amplitude of current 66. However, currents 66 and 62 have an amplitude based on the exposure level and therefore a signal which will be utilized as a feedback signal has to be proportional to the exposure level. As a result, in order to utilize the signal 70 as a feedback signal, the DC level of the signal 70 has to be scaled to be proportional to the exposure level. The DC restoration block 72 utilizes a DC restoration factor to scale the DC value of the signal 70. It should be noted that the DC restoration factor depends on the exposure level of each raster scanner.

However, some raster scanners have several exposure levels from which the user can select one. In these types of raster scanners, depending on the selected exposure level, the DC restoration factor will have a different value.

For these types of raster scanners, a hardware logic such as a microprocessor 74 selects a proper DC restoration factor 76 for the feedback signal based on any given exposure level 58 that the user selects. The DC restoration block 72 utilizes the selected DC restoration factor 76 from the microprocessor 74 to scale the DC value of the signal 70.

After scaling the DC level of the signal 70, the DC restoration block 72 will send a proper feedback signal 56 to the adder 60. The adder 60 receives the feedback signal 56 and also the exposure level 58 and adds them together to generate a current 61 which will adjust the current 62 and 66 of the laser diode driver 52. With the feedback system of this invention, the current 62 will be adjusted for the frequencies which cause the droop or cross talk and therefore the droop or cross talk will be substantially reduced.

What is claimed is:

1. A laser diode assembly comprising:

a laser diode for emitting a light beam;

said laser diode having a laser diode driver;

adding means being operably connected to said laser diode driver;

said laser diode driver being operably connected to a given exposure level through said adding means and being responsive to a train of pixel information for generating a driving current for said laser diode in accordance with the train of pixel information;

low frequency passing means;

said low frequency passing means being operably connected to said laser diode driver for receiving the driving current;

said low frequency passing means being responsive to frequencies below a given frequency of the pixel information of the driving current;

DC restoration means;

said low frequency passing means being operably connected to said DC restoration means;

means for selecting a DC restoration factor;

said DC restoration factor selecting means being operably connected and being responsive to said given exposure level for selecting a DC restoration factor based on said given exposure level;

said DC restoration means being operably connected to said DC restoration factor selecting means for receiving the DC restoration factor and responsive to said low frequency passing means for generating a feedback signal;

said adding means being operably connected to said DC restoration means for receiving said feedback signal and for adding said feedback signal to said given exposure level for adjusting the current for said laser diode to substantially reduce droop or crosstalk.

* * * * *